(12) United States Patent
Kato et al.

(10) Patent No.: US 10,416,250 B2
(45) Date of Patent: Sep. 17, 2019

(54) MAGNETIC RESONANCE IMAGING APPARATUS

(71) Applicant: TOSHIBA MEDICAL SYSTEMS CORPORATION, Otawara-Shi (JP)

(72) Inventors: Sojiyuuro Kato, Nasushiobara (JP); Kazuya Okamoto, Saitama (JP); Kazuyuki Soejima, Nasushiobara (JP)

(73) Assignee: Canon Medical Systems Corporation, Otawars-shi (JP)

( * ) Notice: Subject to any disclaimer, the term of this patent is extended or adjusted under 35 U.S.C. 154(b) by 651 days.

(21) Appl. No.: 14/961,245

(22) Filed: Dec. 7, 2015

(65) Prior Publication Data

US 2016/0169991 A1 Jun. 16, 2016

(30) Foreign Application Priority Data

Dec. 11, 2014 (JP) .................. 2014-250634

(51) Int. Cl.
*G01V 3/00* (2006.01)
*G01R 33/36* (2006.01)

(52) U.S. Cl.
CPC ................. *G01R 33/3692* (2013.01)

(58) Field of Classification Search
CPC .. G01R 33/34; G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616;
(Continued)

(56) References Cited

U.S. PATENT DOCUMENTS

2011/0227574 A1* 9/2011 Akita ................. G01R 33/3692
324/322
2012/0313645 A1* 12/2012 Biber ................. G01R 33/3692
324/322

(Continued)

FOREIGN PATENT DOCUMENTS

JP 2007-504878 3/2007
JP 2010-29644 2/2010
JP 2011-189079 9/2011

OTHER PUBLICATIONS

Office Action dated Jul. 24, 2018 in Japanese Patent Application No. 2014-250634.

*Primary Examiner* — Thang X Le
(74) *Attorney, Agent, or Firm* — Oblon, McClelland, Maier & Neustadt, L.L.P.

(57) ABSTRACT

In one embodiment, an MRI apparatus includes a wireless RF coil; a control side oscillator configured to output a control-side clock signal used for executing a pulse sequence; and a synchronization signal transmission circuit configured to wirelessly transmit a synchronization signal to the wireless RF coil in an executing period of the pulse sequence, except an MR-signal detection period during which the wireless RF coil detects a magnetic resonance signal, wherein the synchronization signal is within a frequency band of a Larmor frequency and reflects a phase of the control-side clock signal.

12 Claims, 8 Drawing Sheets

(58) Field of Classification Search
CPC ............ G01R 33/56509; G01R 33/341; G01R 33/385; G01R 33/56358; A61B 5/055; A61B 5/0555; A61B 5/7278; A61B 5/725
See application file for complete search history.

(56) References Cited

U.S. PATENT DOCUMENTS

| | | | |
|---|---|---|---|
| 2013/0342198 A1* | 12/2013 | Vester | G01R 33/3621 324/307 |
| 2014/0218034 A1* | 8/2014 | Ishii | G01R 33/3692 324/322 |
| 2014/0218035 A1* | 8/2014 | Okamoto | G01R 33/3692 324/322 |
| 2014/0266190 A1* | 9/2014 | Bollenbeck | G01R 33/56 324/307 |
| 2015/0066413 A1* | 3/2015 | Bhagat | G01R 33/3692 702/104 |
| 2015/0087966 A1* | 3/2015 | Anderson | A61B 5/0002 600/415 |

* cited by examiner

MAGNETIC RESONANCE IMAGING APPARATUS

CROSS-REFERENCE TO RELATED APPLICATIONS

This application claims the benefit of priority of Japanese Patent Application No. 2014-250634, filed on Dec. 11, 2014, the entire contents of which are incorporated herein by reference.

FIELD

Embodiments described herein relate generally to magnetic resonance imaging apparatus.

BACKGROUND

MRI is an imaging method which magnetically excites nuclear spin of an object placed in a static magnetic field with an RF pulse having the Larmor frequency and reconstructs an image based on MR signals generated due to the excitation. The above-described MRI means magnetic resonance imaging, the RF pulse means a radio frequency pulse, and the MR signal means a magnetic resonance signal.

Here, an RF (Radio Frequency) coil is a coil device which applies an RF pulse to nuclear spin inside an object by, for example, supplying a coil with an RF pulse electric current and receives generated echo signals as MR signals. RF coils are classified into the following three types in terms of transmission and reception: a transmit-only RF coil, a receive-only RF coil, and a dual-purpose RF coil used for transmitting of RF pulses and receiving of MR signals. In addition, RF coils are also classified into a whole body type and a local type.

Since MR signals emitted from an object are weak, it is preferable to receive MR signals at a position as close to the object as possible. Thus, various types of the local RF coils, each of which is shaped so as to fit each part of a human body, are used depending on an imaging part.

In MRI, multi-channel system is developed in an acquisition system of MR signals. The above-described channel means each of pathways of MR signals outputted from each of coil elements and inputted to an RF receiver of an MRI apparatus. The number of channels is set to equal to or smaller than the input reception number of the RF receiver.

If the number of cables between an RF coil and a control side of an MRI apparatus such as an RF receiver side increases due to development of the above-described multichannel system, hard-wiring becomes complicated. Thus, wireless RF coils which wirelessly transmit/receive data between an RF coil and a control side of an MRI apparatus are developed.

In an MRI system configured to digitize MR signals and wirelessly transmit the digitized MR signals, a control-side clock signal of an MRI apparatus to be used as a reference and a coil-side clock signal inside a wireless RF coil are synchronized with each other in some way. This is because even if two oscillators, one of which is in the wireless RF coil and another of which in the control side of the MRI apparatus, output nominally the same frequency, two frequencies outputted by the respective two oscillators do not completely match each other due to individual differences. Thus, even if the phases of the respective two oscillators in the wireless RF coil side and the control side are matched each other at a certain time point, the phases of the respective two oscillators gradually shift from each other unless processing of synchronizing the coil-side clock signal with the control-side clock signal is continued.

When a synchronization signal is wirelessly transmitted from a control side of an MRI apparatus to a wireless RF coil side, an electromagnetic wave used for the synchronization signal must conform to the Radio Law and/or Regulations. However, Law or Regulations concerning radio transmission are different from country to country. Thus, the same transmission frequency and modulation system as those permitted in a certain country cannot always be used in another country.

DETAILED DESCRIPTION

In one embodiment, an MRI apparatus includes a wireless RF coil; a control side oscillator configured to output a control-side clock signal used for executing a pulse sequence; and a synchronization signal transmission circuit configured to wirelessly transmit a synchronization signal to the wireless RF coil in an executing period of the pulse sequence, except an MR-signal detection period during which the wireless RF coil detects a magnetic resonance signal, wherein the synchronization signal is within a frequency band of a Larmor frequency and reflects a phase of the control-side clock signal.

<First Embodiment>

Since RF pulses having a Larmor frequency are used in an MRI apparatus, electromagnetic waves within a frequency band of the Larmor frequency can be used in a country where installation and use of the MRI apparatus is permitted, regardless of the regulation of radio waves in that country.

For the above reason, in the first embodiment, a synchronization signal whose frequency is fixed within the frequency band of the Larmor frequency is continuously transmitted wirelessly from a whole body coil 34 of a gantry 30 of an MRI apparatus 10A during an executing period of a pulse sequence, while avoiding each period during which MR signal is received by a wireless RF coil 100 (see FIG. 1, FIG. 2, FIG. 4, and FIG. 5).

The RF coil 100 receives each synchronization signal, and synchronizes the clock in the RF coil 100 with the received synchronization signal. Thereby, clock synchronization between the control side of the MRI apparatus 10A and the wireless RF coil 100 side is achieved in digital radio communication of MR signals, regardless of regulations of radio waves which are different from country to country.

Figure 5:
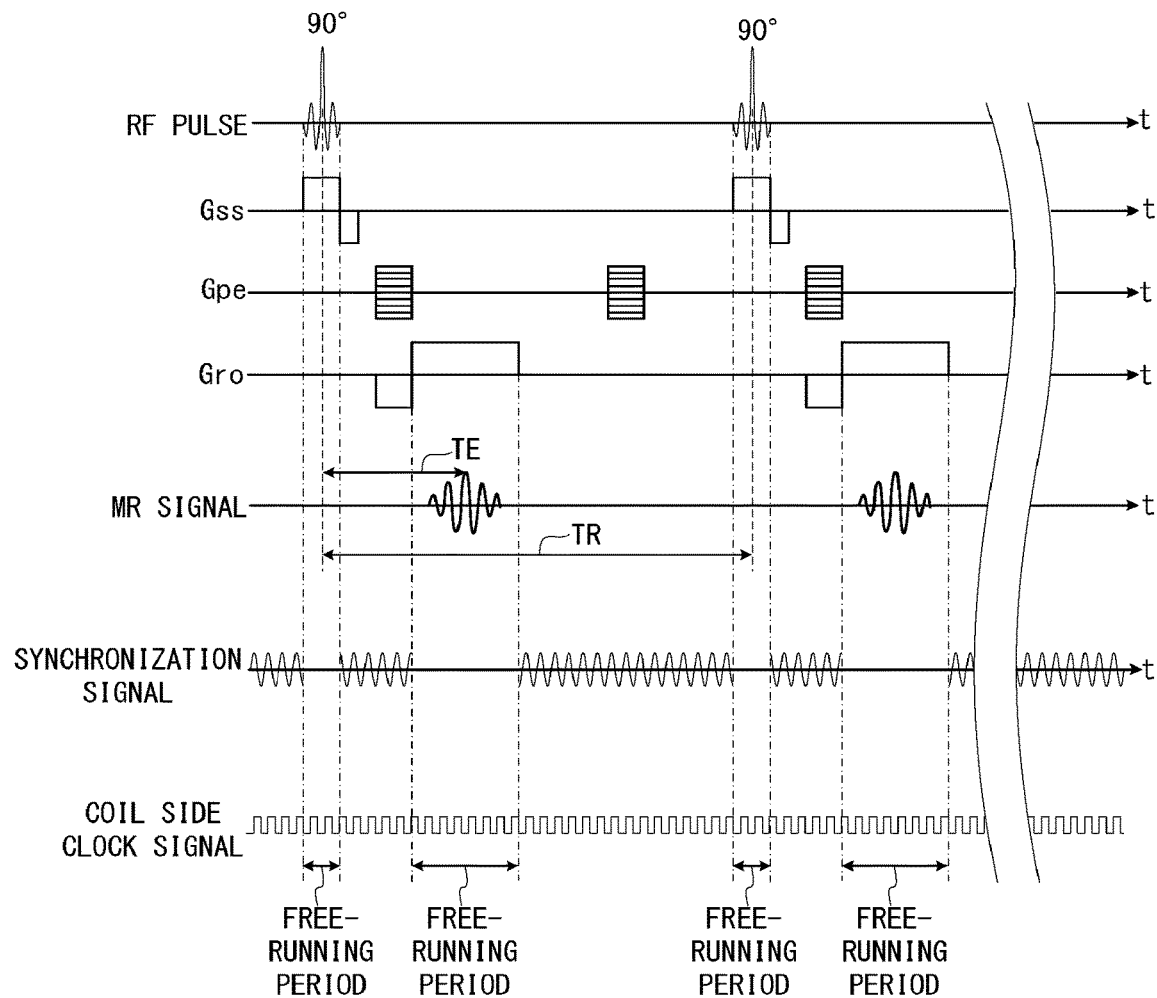
FIG. 5 is a timing chart showing an example of temporary suspension of the synchronization signal in the first embodiment.
Figure 6:
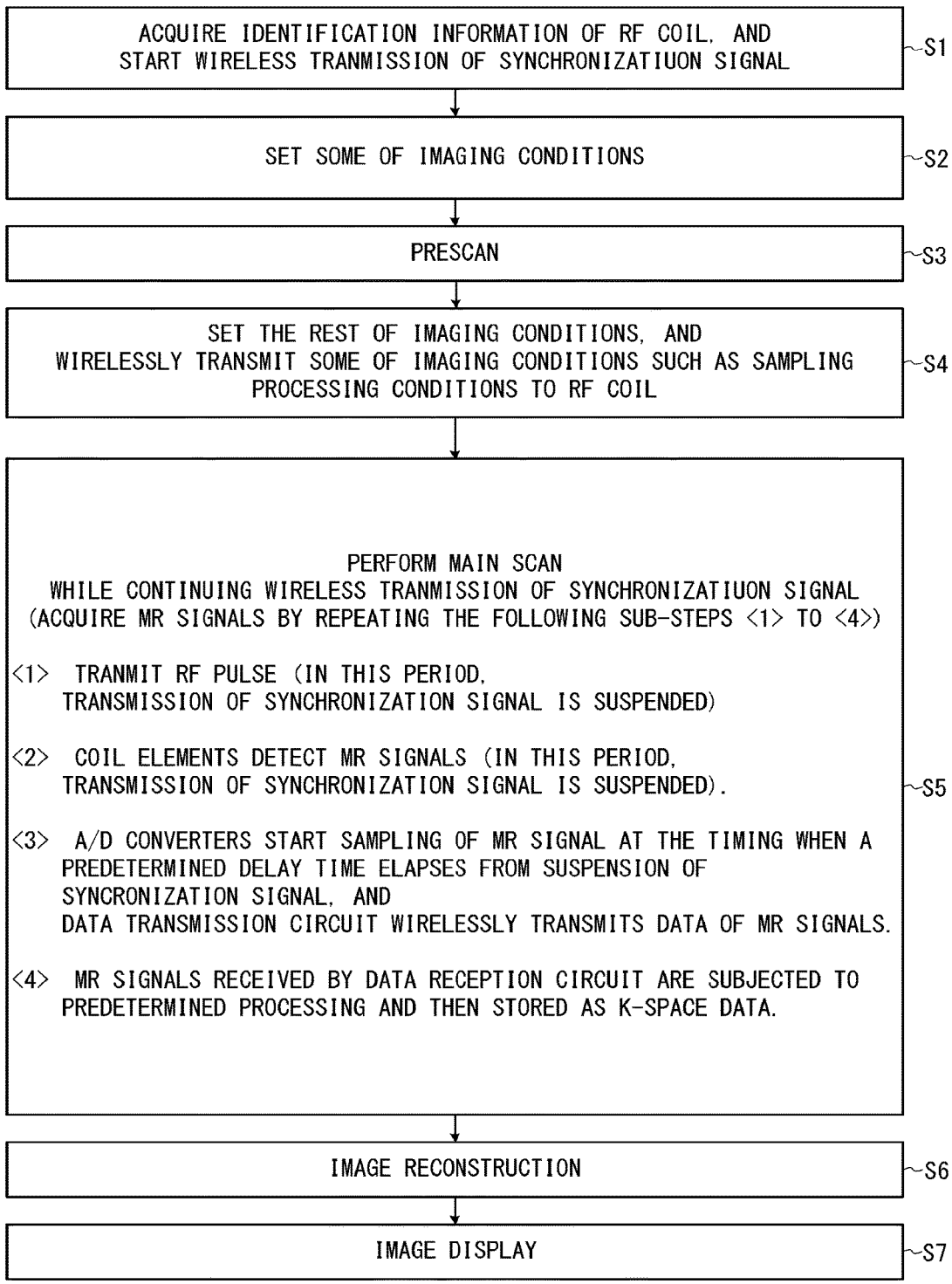
FIG. 6 is a flowchart showing an example of a flow of an operation performed by the MRI apparatus of the first embodiment.

Hereinafter, details of the first embodiment will be explained in the order of overall configuration of the MRI apparatus 10A (FIG. 1), an example of configuration of the whole body coil 34 (FIG. 2), an example of configuration of the RF coil 100 (FIG. 3), an example of configuration of a digital radio communication system (FIG. 4), a timing chart of synchronization processing in a period during which a pulse sequence is running (FIG. 5), an example of a flow of an imaging operation (FIG. 6). Note that the same reference numbers are given for identical components in each figure, and duplicate explanation is omitted.

Figure 1:
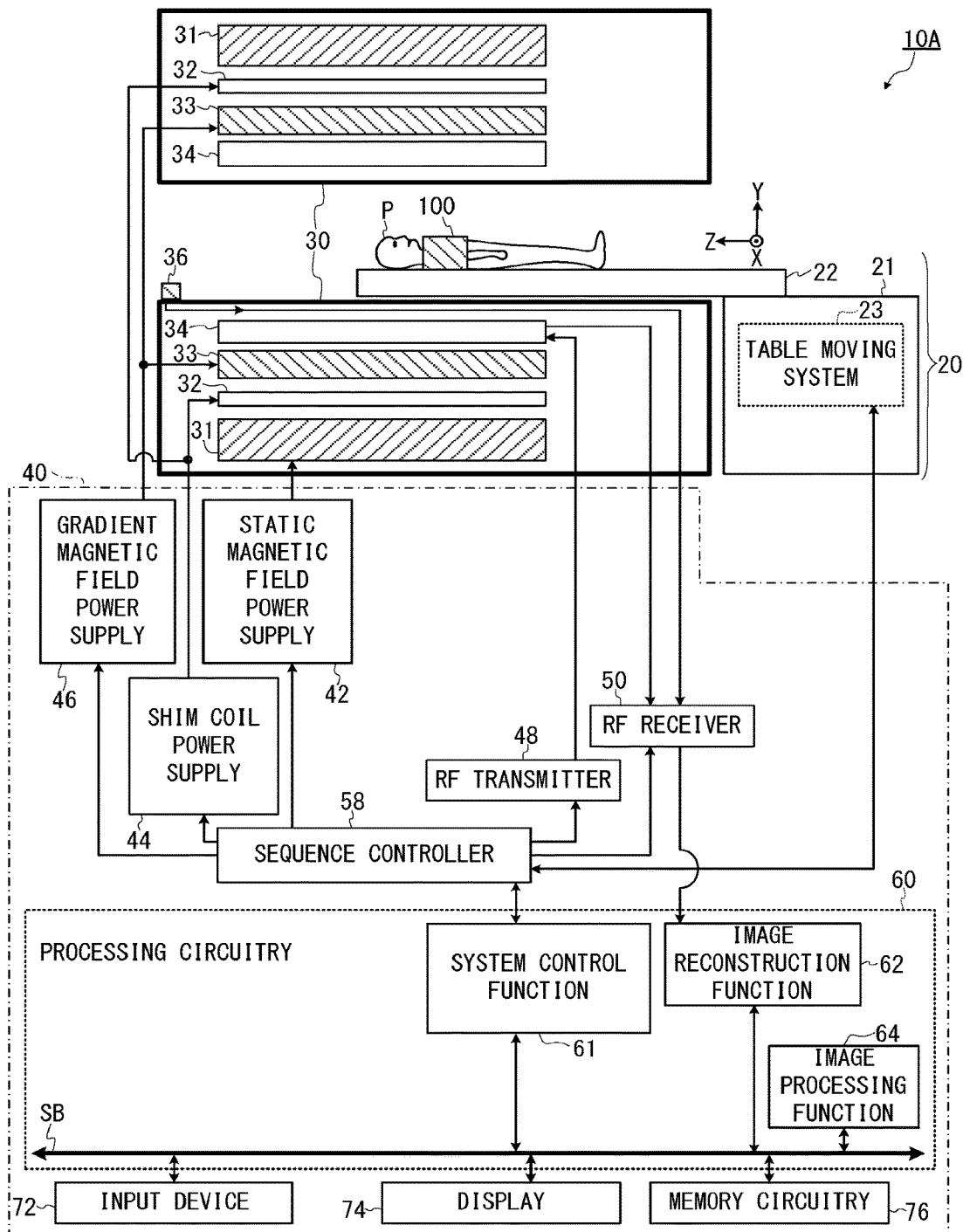
FIG. 1 is a functional block diagram showing an example of overall configuration of the MRI apparatus of the first embodiment.

FIG. 1 is a functional block diagram showing an example of overall configuration of the MRI apparatus 10A of the first embodiment. As an example here, the components of the MRI apparatus 10A will be explained by sorting them into three groups: a bed 20, a gantry 30, and a control device 40.

Firstly, the bed 20 includes a supporting platform 21, a table 22, and a table moving system 23 disposed inside the supporting platform 21. An object P is loaded on the top surface of the table 22. As an example here, it is assumed that the RF coil 100 for the chest configured to wirelessly transmit data of MR signals is attached to the chest of an object P. Although it is assumed that the RF coil 100 is a part of the MRI apparatus 10A, this is only an example of interpretation. The RF coil 100 may be interpreted as a component provided separately from the MRI apparatus 10A.

The supporting platform 21 supports the table 22 in such a manner that the table 22 can move in the horizontal direction (i.e., the Z axis direction in the apparatus coordinate system). The table moving system 23 adjusts the position of the table 22 in the vertical direction by adjusting the height of the supporting platform 21, when the table 22 is located outside the gantry 30. In addition, the table moving system 23 inserts the table 22 into inside of the gantry 30 by moving the table 22 in the horizontal direction and moves the table 22 to outside of the gantry 30 after completion of imaging.

Secondly, the gantry 30 is shaped in the form of a cylinder, for example, and is installed in an imaging room. The gantry 30 includes a static magnetic field magnet 31, a shim coil 32, a gradient coil 33, a whole body coil 34, and a radio communication device 36.

The static magnetic field magnet 31 is, for example, a superconductivity coil and shaped in the form of a cylinder. The static magnetic field magnet 31 forms a static magnetic field in an imaging space by using electric currents supplied from a static magnetic field power supply 42 of the control device 40 described below. The above-described imaging space means, for example, a space in the gantry 30 in which the object P is placed and to which the static magnetic field is applied. Note that the static magnetic field power supply 42 may be omitted by configuring the static magnetic field magnet 31 as a permanent magnet.

The shim coil 32 is, for example, shaped in the form of a cylinder and arranged inside the static magnetic field magnet 31 so as to become coaxial with the static magnetic field magnet 31. The shim coil 32 forms an offset magnetic field which uniforms the static magnetic field by using electric currents supplied from a shim coil power supply 44 of the control device 40 described below.

The gradient coil 33 is, for example, shaped in the form of a cylinder and arranged inside the shim coil 32. The gradient coil 33 includes a non-illustrated X axis gradient coil, a non-illustrated Y axis gradient coil, and a non-illustrated Z axis gradient coil.

In this specification, the X axis, the Y axis and the Z axis are assumed to be those of the apparatus coordinate system unless otherwise specifically noted. As an example here, the X axis, Y axis, and Z axis of the apparatus coordinate system are defined as follows.

First, the Y axis direction is defined as the vertical direction, and the table 22 is arranged in such a position that the direction of the normal line of its top surface becomes equal to the Y axis direction. The horizontal moving direction of the table 22 is defined as the Z axis direction, and the gantry 30 is installed in such a manner that its axis direction becomes equal to the Z axis direction. The X axis direction is the direction perpendicular to these Y axis direction and Z axis direction, and is the width direction of the table 22 in the example of FIG. 1.

The X axis gradient coil forms a gradient magnetic field Gx in the X axis direction in an imaging region according to an electric current supplied from a gradient coil power supply 46 described below. Similarly, the Y axis gradient coil forms a gradient magnetic field Gy in the Y axis direction in an imaging region according to an electric current supplied from the gradient coil power supply 46. Similarly, the Z axis gradient coil forms a gradient magnetic field Gz in the Z axis direction in an imaging region according to an electric current supplied from the gradient coil power supply 46.

Thereby, directions of a gradient magnetic field Gss in a slice selection direction, a gradient magnetic field Gpe in a phase encoding direction, and a gradient magnetic field Gro in a readout (i.e., frequency encoding) direction can be arbitrarily selected as logical axes, by combining the gradient magnetic fields Gx, Gy and Gz in the X axis, the Y axis, and the Z axis directions as three physical axes of the apparatus coordinate system.

The above-described imaging region means, for example, at least a part of an acquisition range of MR signals used to generate one image or one set of images, which becomes an image. For example, when MR signals are acquired in a range wider than a region made into an image in order to prevent aliasing, the imaging region is a part of the acquisition range of MR signals. The above-described one set of images means, for example, plural images when MR signals of the plural images are acquired in a lump in one pulse sequence such as multi-slice imaging.

The whole body coil 34 is, for example, shaped in the form of a cylinder and arranged inside the gradient coil 33. The whole body coil 34 implements a function of applying RF pulses and a function of receiving MR signals.

The radio communication device 36 wirelessly transmits control information such as conditions of a pulse sequence to the RF coil 100, and receives data of MR signals from the RF coil 100. Details of this operation will be described below by reference to FIG. 4.

Thirdly, the control device 40 includes the static magnetic field power supply 42, the shim coli power supply 44, the gradient coil power supply 46, an RF transmitter 48, an RF receiver 50, a sequence controller 58, processing circuitry 60, an input device 72, a display 74, and memory circuitry 76. Although the control device 40 further includes other components such as a frequency upconversion circuit 80, a pulse waveform generation circuit 82, a fixed frequency generation circuit 84, and a variable frequency generation circuit 86, these components are omitted in FIG. 1 to avoid complicacy and are explained in FIG. 4 as described below.

As mentioned above, the gradient coil power supply 46 supplies electric currents for forming the gradient magnetic fields Gx, Gy, and Gz to each of the X axis gradient coil, the Y axis gradient coil, and the Z axis gradient coil.

The RF transmitter 48 generates RF pulse electric currents of the Larmor frequency for causing nuclear magnetic resonance, and outputs the generated RF pulse electric currents to the whole body coil 34. The RF pulses in accordance with these RF pulse electric currents are applied to the object P by the whole body coil 34.

The RF coil 100 receives MR signals generated due to excited nuclear spin inside the object P by the RF pulses, and the received MR signals are wirelessly transmitted to the radio communication device 36 and then inputted to the RF receiver 50. Note that, when the whole body coil 34 receives MR signals from the object P, the MR signals received by the whole body coil 34 are inputted to the RF receiver 50 by wire.

The RF receiver 50 generates raw data which are digitized complex number data of MR signals obtained by performing predetermined signal processing on the received MR signals. The RF receiver 50 outputs the generated raw data of MR signals to an image reconstruction function 62 of the processing circuitry 60.

The sequence controller 58 stores control information needed in order to drive the gradient coil power supply 46, the RF transmitter 48, and the RF receiver 50 according to commands inputted from the processing circuitry 60. The above-described control information includes, for example, sequence information describing operation control information such as intensity, an application period and an application timing of the pulse electric currents which should be applied to the gradient coil power supply 46.

The sequence controller 58 generates the gradient magnetic fields Gx, Gy and Gz and RF pulses by driving the gradient coil power supply 46, the RF transmitter 48, and the RF receiver 50 according to a predetermined sequence stored therein.

The sequence controller 58 may be configured as special-purpose hardware. Additionally or alternatively, the sequence controller 58 may include a processor which implement each of the above-described functions by software processing.

The processing circuitry 60 may also be configured as special-purpose hardware or include a processor which implements various types of functions by software processing.

Hereinafter, an example in which the processing circuitry 60 implements various types of functions by software processing of the processor will be explained.

Specifically, as shown in FIG. 1, the processing circuitry 60 implements a system control function 61, an image reconstruction function 62, and an image processing function 64, by executing programs stored in the memory circuitry 76 or programs directly stored in the processor of the processing circuitry 60.

The above-described term "processor" means, for instance, a circuit such as a CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device) as examples, and an FPGA (Field Programmable Gate Array).

The number of processors included in the processing circuitry 60 may be one, two, or more. Similarly, the number of processors included in the sequence controller 58 may be one, two, or more.

The system control function 61 of the processing circuitry 60 implements system control of the entirety of the MRI apparatus 10A in setting of imaging conditions of a main scan, an imaging operation, and image display after imaging through interconnection such as a system bus SB.

The above-described imaging condition refers to under what condition RF pulses and the like are applied in what type of pulse sequence, and under what condition MR signals are acquired from the object P, for example. As parameters of the imaging conditions, for example, there are an imaging region as positional information in the imaging space, a flip angle, a repetition time TR, number of slices, an imaging part and type of pulse sequence such as spin echo and parallel imaging. The above-described imaging part means a region of the object P to be imaged, such as the head, the chest, and the abdomen.

The above-described main scan is a scan for imaging an intended diagnosis image such as a T1 weighted image, and it does not include a scan for acquiring MR signals for a scout image or a tuning scan. A scan is an operation of acquiring MR signals, and it does not include image reconstruction processing.

The above-described tuning scan is, for example, a scan for determining unconfirmed elements of imaging conditions, conditions and data used for image reconstruction processing and correction processing after the image reconstruction, and the tuning scan is performed separately from the main scan.

As an example of a tuning scan, there is a sequence of calculating the center frequency of the RF pulses used in the main scan. A prescan is a tuning scan which is performed before the main scan.

In addition, the system control function 61 causes the display 74 to display screen information for setting imaging conditions. Then, the system control function 61 sets the imaging conditions based on command information inputted from the input device 72, and outputs the determined imaging conditions to the sequence controller 58. Furthermore, the system control function 61 causes the display 74 to display images indicated by the generated display image data after completion of imaging.

The input device 72 includes input tools such as a mouse and a keyboard and provides a user with a function to set imaging conditions and image processing conditions.

The image reconstruction function 62 of the processing circuitry 60 arranges and stores the raw data of MR signals inputted from the RF receiver 50 as k-space data, according to the phase encode step number and the frequency encode step number. The above-described k-space means a frequency space. The image reconstruction function 62 generates image data of the object P by performing image reconstruction processing including Fourier transformation on the k-space data. The image reconstruction function 62 outputs the generated image data to the image processing function 64 and stores the generated image data in the memory circuitry 76.

The image processing function 64 of the processing circuitry 60 performs predetermined image processing on the reconstructed image data, and stores the image data being subjected to the image processing in the memory circuitry 76 as display image data.

The memory circuit 76 stores the display image data after adding accompanying information such as the imaging conditions used for generating the display image data and information of the object P (i.e., patient information) to the display image data.

Incidentally, the four components including the processing circuitry 60, the input device 72, the display 74, and the memory circuitry 76 may be configured as one computer and installed in a control room, for example.

Although the components of the MRI apparatus 10A are sorted into three groups including the gantry 30, the bed 20 and the control device 40 in the above explanation, this is only an example of interpretation. For example, the table moving system 23 may be interpreted as a part of the control device 40.

Additionally or alternatively, the RF receiver 50 may be configured not as a component of the control device 40 disposed outside the gantry 30 but as a component of the gantry 30 disposed inside the gantry 30. In this case, as to output of data of MR signals to the outside of the gantry 30, for example, an optical communication cable is preferably used to transmit the data of MR signals in the form of optical digital signals. This is because the effect of external noise is reduced.

Figure 2:
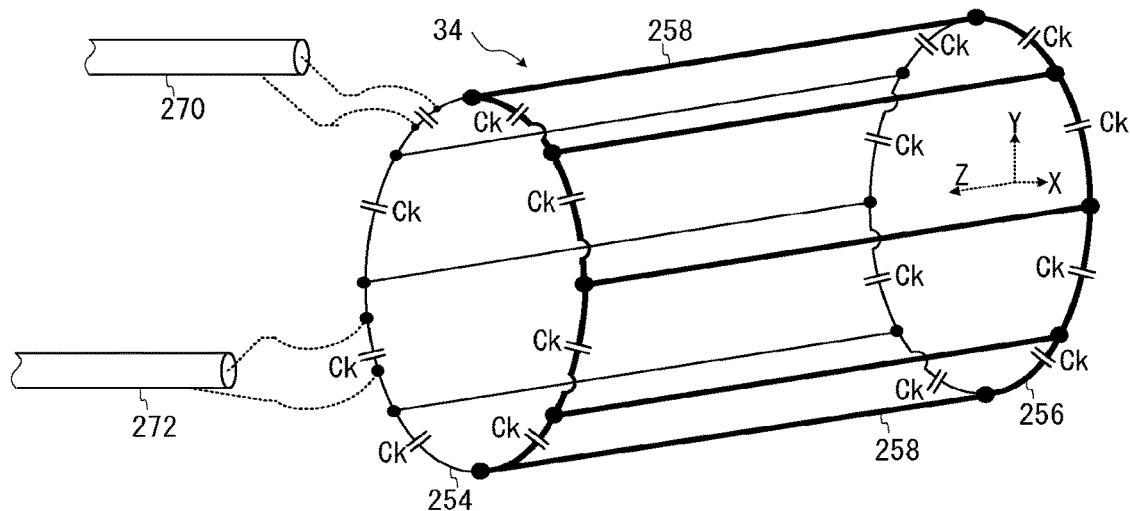
FIG. 2 is a schematic perspective view showing an example of an equivalent circuit of the whole body coil of the MRI apparatus of the first embodiment.

FIG. 2 is a schematic perspective view showing an example of an equivalent circuit of the whole body coil 34 of the MRI apparatus 10A of the first embodiment. In FIG. 2, the conducting wires of the circuit of the whole body coil 34 located on the plus side (i.e., near side) in the X axis direction are indicated by bold lines and the conducting wires located on the minus side (i.e., remote side) in the X axis direction are indicated by fine lines in order to make the respective wires distinguishable. In addition, as to each of the points where one conducting wire intersects with another conducting wire, an electrically connected point is indicated by a filled circle and a non-connected point is distinguished from the electrically connected points by semicircularly indicating either conducting wire.

The whole body coil 34 includes a first loop conductor 254, a second loop conductor 256, eight connecting conductors (i.e., rungs) 258, and sixteen capacitors Ck.

In FIG. 2, the first loop conductor 254 corresponds to the ring on the left side in parallel with an X-Y plane, and the second loop conductor 256 corresponds to the ring on the right side in parallel with an X-Y plane.

The connecting conductors 258 correspond to eight straight lines extending along the Z axis direction as an example in FIG. 2. Each of the eight connecting conductors 258 is connected to the first loop conductor 254 on its one end and is connected to the second loop conductor 256 on its other end.

Thus, the first loop conductor 254 includes eight connection nodes connected with the respective eight connecting conductors 254, and eight capacitors Ck are inserted between these eight connection nodes of the first loop conductor 254 one by one. The same holds true for the second loop conductor 256.

As mentioned above, the whole body coil 34 is configured as a birdcage type of eight elements, and its circuit constants are determined so that the resonance frequency matches the Larmor frequency. The above-described circuit constants are, for example, (a) the capacitance value of each capacitor Ck, (b) wiring inductance of each of the first loop conductor 254, the second loop conductor 256, and the connecting conductors 258, and (c) wiring capacity of each of the first loop conductor 254, the second loop conductor 256, and the connecting conductors 258.

High-frequency transmission/reception cables 270 and 272 extended from the RF transmitter 48 are separately connected to the first loop conductor 254 so that the angle in an X-Y plane between the connection node connected with the high-frequency transmission/reception cable 270 and the connection node connected with the high-frequency transmission/reception cable 272 becomes 90 degrees. Thus, the whole body coil 34 is supplied with electric power by a QD (quadrature phase) system. In FIG. 2, wires of these high-frequency transmission/reception cables 270 and 272 connected with the whole body coil 34 are shown by broken lines for distinction.

As one of characteristics of the first embodiment, the whole body coil 34 implements a function of applying RF pulses of the Larmor frequency and a function of transmitting a synchronization signal on which the phase of the control-side clock signal of the MRI apparatus 10A is reflected. This synchronization signal is received by the RF coil 100, and used for processing of synchronizing the coil-side clock signal inside the RF coil 100 with the control-side clock signal. This synchronization signal is set to a fixed frequency within the frequency band of the Larmor frequency for the following reasons.

Firstly, since the circuit constants of the whole body coil 34 are selected so that the whole body coil 34 resonate at the Larmor frequency, energy conversion efficiency is reduced if the frequency of the synchronization signal is too separated from the Larmor frequency. The above-described energy conversion efficiency means, for example, a ratio between a current value flowing through the whole body coil 34 and intensity of a radiated electromagnetic wave.

Secondly, as described in the second embodiment below, when one of the coil elements 106a to 106h (FIG. 3) of the RF coil 100 implements two functions of detecting MR signals and receiving a synchronization signal, reception sensitivity to a synchronization signal is reduced. In other words, since the frequency of each RF pulse is the Larmor frequency, the frequency of MR signals emitted from the object P is also the Larmor frequency and the circuit constants of the respective coil elements 106a to 106h are selected so that their reception sensitivity to an electromagnetic wave of the Larmor frequency becomes high. Note that, in the first embodiment, an antenna which receives a synchronization signal is further provided in the RF coil 100, aside from the coil elements 106a to 106h.

Thus, the above-described "frequency band of the Larmor frequency" means a frequency band by which the whole body coil 34 can output an electromagnetic wave with sufficiently high energy conversion efficiency and the coil elements 106a to 106h can detect MR signals with sufficiently high reception sensitivity. For example, the frequency band whose center is the Larmor frequency and whose bandwidth is 1000 KHz may be used for the frequency band of the Larmor frequency. However, this is only an example of concrete values and should not be interpreted as limiting embodiments of the present invention.

Additionally, it is desirable to slightly shift the frequency of a synchronization signal from the Larmor frequency by a predetermined margin within the range of the frequency band of the Larmor frequency to such a degree that the synchronization signal does not magnetically excites nuclear spin of hydrogen atoms of the object P. The reason is as follows. If a synchronization signal whose frequency is completely equal to the Larmor frequency is outputted, it slightly excites nuclear spin of hydrogen atoms of the object P, which gives an effect like a presaturation pulse and influences image quality.

However, intensity of a synchronization signal is usually, for example, equal to or smaller than 1% of intensity of the RF pulse. Thus, if there is not possibility of magnetically exciting nuclear spin of hydrogen atoms of the object P, a synchronization signal whose frequency is equal to the Larmor frequency may be used. As the frequency of a synchronization signal becomes closer to the Larmor frequency, the energy conversion efficiency of transmitting a synchronization signal and reception efficiency of the coil elements 106a to 106h become higher as advantageous points.

In addition, the whole body coil 34 is not limited to a birdcage type like the one shown in FIG. 2. The whole body coil 34 may be shaped in another form, as long as it is equipped with the function of applying RF pulses of the Larmor frequency and the function of transmitting a synchronization signal within the range of the frequency band of the Larmor frequency.

Figure 3:
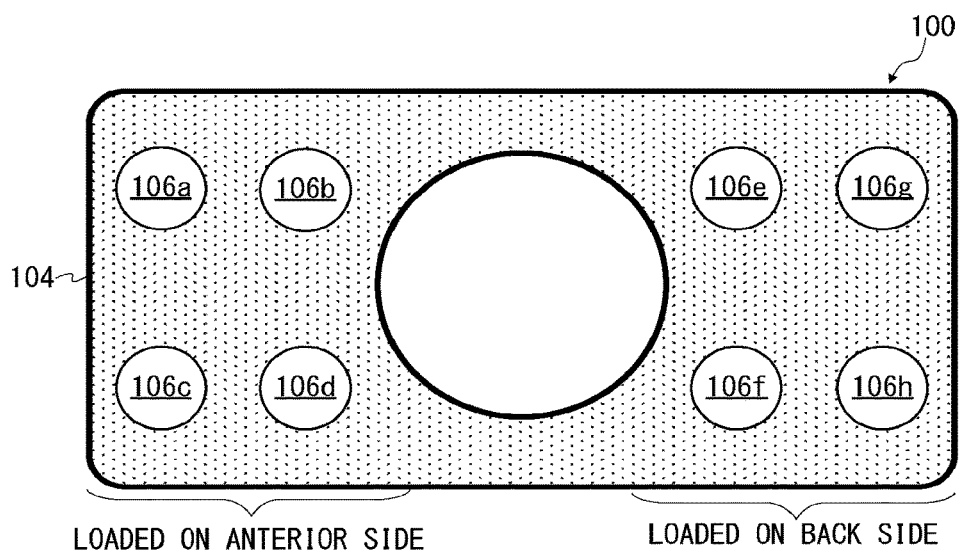
FIG. 3 is a schematic plan view showing an example of overall configuration of the RF coil 100 in FIG. 1.

FIG. 3 is a schematic plan view showing an example of overall configuration of the RF coil 100 in FIG. 1. As shown in FIG. 3, the RF coil 100 has configuration in which eight coil elements 106a, 106b, 106c, 106d, 106e, 106f, 106g, and 106h are included in a cover member 104.

The cover member 104 is made of a flexible material and is capable of deformation such as folding. As such a deformable or flexible material, for example, a flexible circuit board (i.e., Flexible Printed Circuit:FPC) described in Japanese Patent Application Laid-open Publication No. 2007-229004 may be used.

The cover member 104 has a hole in the central part in its longitudinal direction, so that the head of the object P can passes through this hole. For example, the half of the cover member 104 on the left side of this hole in FIG. 3 (i.e., the side of the coil elements 106a to 106d) is set on the chest (i.e., front side) of the object P, and the opposite side (i.e., the side of the coil elements 106e to 106h) is set to the back side of the object P. Although explanation of components of the control system of the RF coil 100 is omitted in FIG. 3, it will be explained by reference to the next FIG. 4.

Figure 4:
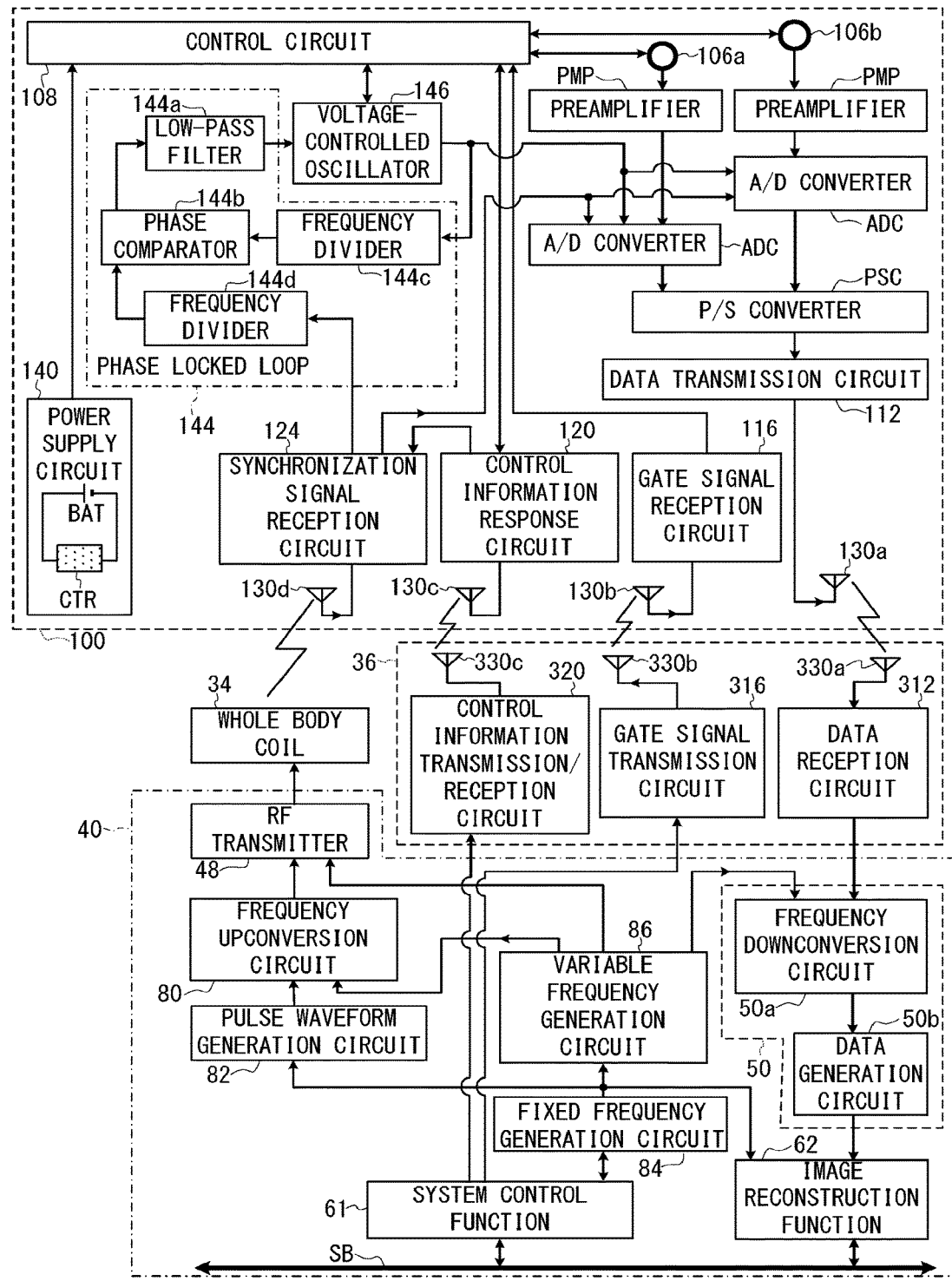
FIG. 4 is a functional block diagram showing an example of components relevant to the digital radio communication system of the MRI apparatus of the first embodiment.

FIG. 4 is a functional block diagram showing an example of components relevant to the digital radio communication system of the MRI apparatus 10A of the first embodiment.

As shown in FIG. 4, the control device 40 further includes the frequency upconversion circuit 80, the pulse waveform generation circuit 82, the fixed frequency generation circuit 84, and the variable frequency generation circuit 86 in addition to components described in FIG. 1. In addition, the RF receiver 50 includes a frequency downconversion circuit 50a and a data generation circuit 50b.

The radio communication device 36 includes a data reception circuit 312, a gate signal transmission circuit 316, a control information transmission/reception circuit 320, and antennas 330a, 330b, and 330c.

The RF coil 100 includes the above-described coil elements 106a to 106h, preamplifiers PMP, A/D (Analogue/Digital) converters ADC, a P/S (Parallel/Serial) converter PSC, a data transmission circuit 112, a gate signal reception circuit 116, a control information response circuit 120, a synchronization signal reception circuit 124, antennas 130a, 130b, 130c, and 130d, a power supply circuit 140, a phase locked loop 144, and a voltage-controlled oscillator 146.

Note that the coil elements 106c to 106h are not illustrated in FIG. 4 in order to avoid complication. Although eight preamplifiers AMP and eight A/D converter ADC are included in the RF coil 100 so as to correspond to the respective eight coil elements 106a to 106h, only two preamplifiers AMP and two A/D converter ADC corresponding to the respective the coil elements 106a and 106b are shown in FIG. 4 in order to avoid complication.

The phase locked loop 144 of the RF coil 100 includes a low-pass filter 144a, a phase comparator 144b, and frequency dividers 144c and 144d. Details of the respective components of the phase locked loop 144 will be explained in the explanation of radio communication between the whole body coil 34 and the RF coil 100 as described below.

In addition, the power supply circuit 140 of the RF coil 100 includes a rechargeable battery BAT and a charging connector CTR. As an example here, it is assumed that the rechargeable battery BAT is charged by connecting the charging connector CTR to an external power supply in a period during which the RF coil 100 is not used.

Hereinafter, the function of each component of the control device 40 which is not explained in FIG. 1 such as the fixed frequency generation circuit 84 will be first explained, then the radio communication pathway between the whole body coil 34 and the RF coil 100 will be explained, and then three radio communication pathways between the radio communication device 36 and the RF coil 100 will be explained.

In FIG. 4, the fixed frequency generation circuit 84 generates a control-side clock signal which has a fixed (i.e., constant) frequency and is used as a reference of the system control of the MRI apparatus 10A. The control-side clock signal is used for, for example, determination of an application timing of each of RF pulses and gradient magnetic fields Gss, Gpe, and Gro at the time of executing a pulse sequence. The fixed frequency generation circuit 84 includes components for generating the control-side clock signal such as a crystal controlled oscillator with high degree of stability. The fixed frequency generation circuit 84 outputs the reference clock signal to the reference signal transmitting circuit 316 and the variable frequency generation circuit 86. In addition, the fixed frequency generation circuit 84 outputs the control-side clock signal to respective components performing clock synchronization such as the sequence controller 58, the processing circuitry 60, the pulse waveform generation circuit 82, and the variable frequency generation circuit 86.

The variable frequency generation circuit 86 includes a non-illustrated phase locked loop, a DDS (Direct Digital Synthesizer), and a mixer. The variable frequency generation circuit 86 operates on the basis of the above control-side clock signal. The variable frequency generation circuit 86 generates a local clock signal of a variable frequency which is equal to a setting value inputted from the system control function 61 of the processing circuitry 60 as the center frequency of RF pulses, and outputs the generated local clock signal to the frequency downconversion circuit 50a and the frequency upconversion circuit 80.

In order to achieve the above operation, the system control function 61 outputs a default value of the center frequency of the RF pulses to the variable frequency generation circuit 86 before a prescan. In addition, the system control function 61 outputs a corrected value of the center frequency of the RF pulses to the variable frequency generation circuit 86 after the prescan. Moreover, the system control function 61 determines imaging conditions such as a type of RF pulses, band width of each RF pulse based on imaging conditions inputted via the input device 72. The system control function 61 outputs the imaging conditions determined in the above manner to the pulse waveform generation circuit 82.

Furthermore, the variable frequency generation circuit 86 generates a sine-wave synchronization signal whose frequency is within the frequency band of the Larmor frequency, in a manner similar to the above-described generation method of the center frequency of RF pulses.

This synchronization signal can be synchronized with the control-side clock signal, if it is generated by using the direct digital synthesizer or the phase locked loop driven by the control-side clock signal outputted from the fixed frequency generation circuit 84.

As to methods of generating a sine wave of the frequency band of the Larmor frequency on which the phase of the control-side clock signal is reflected, conventional technology may be used and further explanation is omitted. In addition, a waveform of a synchronization signal is not limited to a curved wave such as a sine wave. The waveform of a synchronization signal may be in another form such as a rectangular waveform like a clock signal.

The variable frequency generation circuit 86 outputs a synchronization signal of a fixed frequency within the range of the frequency band of the Larmor frequency, on which the phase of the control-side clock signal is reflected, to the RF transmitter 48. The RF transmitter 48 transmits this synchronization signal to the whole body coil 34, and causes the whole body coil 34 to wirelessly transmit this synchronization signal.

The pulse waveform generation circuit 82 generates a pulse waveform signal of baseband by using the control-side clock signal inputted from the fixed frequency generation circuit 84, according to the imaging conditions inputted from the system control function 61. The pulse waveform generation circuit 82 outputs the pulse waveform signal of baseband to the frequency upconversion circuit 80.

The frequency upconversion circuit 80 multiplies the pulse waveform signal of baseband by the local signal inputted from the variable frequency generation circuit 86, then performs filter processing so that only a desired signal band passes the filter. In this manner, the frequency upconversion circuit 80 performs frequency upconversion. The frequency upconversion circuit 80 outputs the pulse waveform signal of baseband whose frequency is raised, to the RF transmitter 48.

The RF transmitter 48 generates RF pulses based on the inputted pulse waveform signal.

Next, the radio communication pathways between the whole body coil 34 and the RF coil 100 and synchronization processing of the coil-side clock signal inside the RF coil 100 will be explained.

Although the frequency of the control-side clock signal is substantially equal to that of the coil-side clock signal in general, it is not necessarily easy to perfectly match them each other. When there is only a slight difference in frequency between both clock signals, the phases of both clock signals gradually shift from each other even if the phases of both clock signals are matched each other at a certain time point. For the above reason, synchronization processing in which a timing of each rising edge (or each falling edge) is synchronized between the control-side clock signal and the coil-side clock signal is performed inside the RF coil 100 as follows.

First, the synchronization signal reception circuit 124 of the RF coil 100 receives the synchronization signal, which reflects the phase of the control-side clock signal and is wirelessly transmitted from the whole body coil 34, by the antenna 130*d*. Then, the synchronization signal reception circuit 124 outputs the received synchronization signal to the frequency divider 144*d* of the phase locked loop 144.

Here, the voltage-controlled oscillator 146 is a device configured to output the coil-side clock signal and includes, for example, a non-illustrated variable-capacitance diode inside. If voltage applied to the variable-capacitance diode is changed, it causes the capacitance of the variable-capacitance diode to change, thereby the resonance frequency changes, and accordingly the oscillatory frequency of the voltage-controlled oscillator 146 changes.

The phase locked loop 144 perform feedback control of the coil-side clock signal so as to synchronize the phase of the coil-side clock signal with the phase of the control-side clock signal which is reflected on the received synchronization signal.

In order to prevent amplification of signal fluctuation of a short cycle which may cause abnormal oscillation in the phase locked loop 144, the low-pass filter 144*a* is inserted in series between the phase comparator 144*b* and the voltage-controlled oscillator 146.

The phase comparator 144*b* converts phase difference between inputted two signals into voltage and outputs this voltage. One of the two signals inputted to the phase comparator 144*b* is the coil-side clock signal whose frequency is converted into a frequency obtained by dividing its original frequency by a natural number via the frequency divider 144*c*, and corresponds to a feedback signal. The other of the two signals inputted to the phase comparator 144*b* is the synchronization signal whose frequency is converted into a frequency obtained by dividing its original frequency by a natural number via the frequency divider 144*d*.

In addition, it is preferable to match the frequency of the one input signal to the phase comparator 144*b* with the frequency of the other input signal to the phase comparator 144*b*, in order to accurately detect phase difference.

Thus, each of the frequency dividers 144*c* and 144*d* converts an inputted frequency into a frequency obtained by dividing the inputted frequency by a natural number, so as to output the greatest common denominator between the frequency of the synchronization signal and the frequency of the coil-side clock signal.

According to the above-described circuit configuration, the coil-side clock signal outputted from the voltage-controlled oscillator 146 is inputted to the frequency dividers 144*c* of the phase locked loop 144 via its negative feedback loop. Thus, the phase locked loop 144 and the voltage-controlled oscillator 146 operate so as to reduce difference in phase between the coil-side clock signal and the control-side clock signal, which reflects the phase of the synchronization signal and is inputted to the phase locked loop 144. Thereby, timings of a rising edge and a falling edge of the coil-side clock signal are controlled so as to match timings of a rising edge and a falling edge of the control-side clock signal.

When the frequency of the synchronization signal is equal to the frequency of the coil-side clock signal, the frequency dividers 144*c* and 144*d* can be omitted. In addition, when the frequency of the coil-side clock signal is a multiple of the frequency of the synchronization signal, the frequency dividers 144*d* can be omitted.

Next, three radio communication pathways between the radio communication device 36A and the RF coil 100 will be explained.

Firstly, a gate signal is continuously transmitted by radio from the gate signal transmission circuit 316 of the radio communication device 36 to the gate signal reception circuit 116 of the RF coil 100 between the antennas 330*b* and 130*b* during imaging.

More specifically, as a switch changing the on/off state of each of the coil elements 106a to 106h inside the RF coil 100, for example, a trap circuit including a PIN diode (p-intrinsic-n diode) is provided for each of the coil elements 106a to 106h. The gate signal is a control signal of the above-described switch, i.e., a signal which controls a switching timing between the on-state and off-state of each trap circuit.

The gate signal reception circuit 116 switches between the on-state and off-state of each of the coil elements 106a to 106h, by inputting the received gate signal to the switch of each of the coil elements 106a to 106h. Incidentally, a trigger signal may be transmitted from the gate signal transmission circuit 316 to the gate signal reception circuit 116 so that the gate signal is generated inside the gate signal reception circuit 116 based on the trigger signal.

In a period during which RF pulses are applied to the object P, the gate signal inputted to the RF coil 100 via the gate signal transmission circuit 316, the antennas 330b and 130b, and the gate signal reception circuit 116 is generally set to on-level. During the on-level period of the gate signal, the above switch becomes the off-state so as to disconnect the loop of each of the coil elements 106a to 106h and thereby each of the coil elements 106a to 106h cannot detect MR signals.

Except the period during which RF pulses are applied to the object P, the gate signal adjusted to off-level is wirelessly transmitted, for example. While the gate signal is off-level, the above switch becomes the on-state and each of the coil elements 106a to 106h can detect MR signals. Coupling effect between the RF coil for applying RF pulses to the object P such as the whole body coil 34 and each of the coil elements 106a to 106h for detecting MR signals is prevented by the above-described switching operation between the on-state and the off-state.

Secondly, digitized MR signals are wirelessly transmitted from the data transmission circuit 112 of the RF coil 100 to the data reception circuit 312 of the radio communication device 36 between the antennas 130a and 330a.

Specifically, the analogue MR signals detected by at least one of the coil elements 106a to 106h are inputted to the corresponding preamplifier(s) AMP and amplified, and then inputted to the corresponding A/D converter(s) ADC and digitized. Here, the coil-side clock signal is continuously inputted from the voltage-controlled oscillator 146 to each of the A/D converters ADC. In addition, the synchronization signal reception circuit 124 detects the timing at which wireless transmission of the synchronization signal is stopped immediately before detection period of an MR signal, as an A/D conversion trigger timing by the antenna 130d. Further, the synchronization signal reception circuit 124 outputs an A/D conversion trigger signal to each of the A/D converters ADC, at the detected A/D conversion trigger timing on a real-time basis.

Each of the A/D converters ADC starts sampling processing (i.e., quantization) of the MR signals based on the coil-side clock signal, at the timing when a predetermined delay time elapses from the timing of receiving the A/D conversion trigger signal. Each of the A/D converters ADC outputs the digitized MR signals to the P/S converter PSC.

However, if at least one of coil elements 106a to 106h is not selected for detecting MR signals, the preamplifier(s) AMP and the A/D converter(s) ADC corresponding to the non-selected coil element(s) do not operate as an example here.

The P/S converter PSC converts the inputted MR signals from parallel signals to a serial signal for wireless transmission, and outputs the serial signal to the data transmission circuit 112.

The data transmission circuit 112 generates the digitized serial signal for wireless transmission in which plural MR signals are included, by performing predetermined processing such as error correction encoding, interleave, modulation, frequency conversion, amplification, and filtering on the inputted serial signal. The data transmission circuit 112 wirelessly transmits the generated serial signal for wireless transmission from the antenna 130a to the antenna 330a.

However, the present embodiment is not limited to the aspect of wirelessly transmitting MR signals as a serial signal. For example, MR signals may be wirelessly transmitted as parallel signals by increasing the number of antennas for transmitting and receiving MR signals.

The data reception circuit 312 performs various types of processing such as amplification, frequency conversion, demodulation, deinterleave, and error correction decoding on the serial signal received by the antenna 330a. Thereby, the data reception circuit 312 extracts the original digitized MR signals from the serial signal for radio transmission, and outputs the extracted MR signals to the frequency downconversion circuit 50a of the RF receiver 50.

The frequency downconversion circuit 50a multiplies the MR signals inputted from the data reception circuit 312 by the local clock signal inputted from the variable frequency generation circuit 86, and performs filtering so that a desired signal band of the MR signals passes. Thereby, the frequency downconversion circuit 50a performs frequency downconversion on the MR signals and outputs the MR signals whose frequency is lowered to the data generation circuit 50b.

The data generation circuit 50b generates raw data of the MR signals by performing predetermined signal processing on the above MR signals whose frequency is lowered, and outputs the raw data of MR signals to the image reconstruction function 62 of the processing circuitry 60. The image reconstruction function 62 converts the raw data of MR signals into k-space data and stores the k-space data in the memory circuitry 76.

Thirdly, in the radio communication pathway between the antennas 130c and 330c, the identification information of the RF coil 100 and imaging conditions are wirelessly transmitted between the control information transmission/reception circuit 320 of the radio communication device 36 and the control information response circuit 120 of the RF coil 100.

When the control information transmission/reception circuit 320 wirelessly transmits a command signal requiring transmission of the identification information from the antenna 330c, the control information response circuit 120 receives the command signal requiring transmission of the identification information by the antenna 130c and then wirelessly transmits the identification information of the RF coil 100 from the antenna 130c. Afterward, the control information transmission/reception circuit 320 receives the identification information of the RF coil 100 by the antenna 330c, and outputs this identification information to the system control function 61 of the processing circuitry 60.

Thereby, the system control function 61 recognizes that the RF coil 100 is used, and outputs permission of communication between the RF coil 100 and the radio communication device 36 to the respective components of the MRI apparatus 10A. Afterward, the control information transmission/reception circuit 320 wirelessly transmits imaging conditions such as conditions of a pulse sequence of the main scan and information on coil elements (at least one of 106a to 106h) selected for detecting MR signals in the main scan, from the antenna 330c. The control information response circuit 120 outputs the imaging conditions received by the antenna 130c to the control circuit 108.

The foregoing is the explanation of the three radio communication pathways between the radio communication device 36 and the RF coil 100.

FIG. 5 is a timing chart showing an example of a synchronization signal including temporary suspensions of transmitting/receiving in the first embodiment. As an example here, a pulse sequence of a gradient echo technique is shown. In FIG. 5, the top part indicates RF pulses, the second top part indicates gradient magnetic fields Gss in the slice selection direction, the third top part indicates gradient magnetic fields Gpe in the phase encode direction, the fourth top part indicates gradient magnetic fields Gro in the readout direction, the fifth top part indicates MR signals, the sixth top part indicates the synchronization signal, and the bottom part indicates the coil-side clock signal.

The pulse sequence of a gradient echo technique shown in FIG. 5 runs as follows.

First, an excitation RF pulse whose flip angle is 90 degrees as an example is applied to an imaging region, at the same time as application of a gradient magnetic field pulse Gss in the slice selection direction whose polarity is positive.

Next, application of the excitation RF pulse is stopped, and at the same time, the polarity of the gradient magnetic field pulse Gss in the slice selection direction is reversed. The gradient magnetic field pulse Gss in the slice selection direction after polarity reversion is referred to as a rephrasing lobe, and its application period is a half of the application period of the gradient magnetic field pulse Gss in the slice selection direction before polarity reversion.

Next, a gradient magnetic field pulse Gpe in the phase encode direction and a gradient magnetic field pulse Gro in the readout direction whose polarity is negative as an example are applied.

Next, at the timing when a half of echo time TE elapses from the application timing of the excitation RF pulse, the polarity of the gradient magnetic field pulse Gro in the readout direction is reversed. Then, an MR signal is emitted from the object P around the echo time TE, and the MR signal is detected by coil elements (106a to 106h) under application of the gradient magnetic field pulse Gro in the readout direction.

Next, after application of the gradient magnetic field pulse Gro in the readout direction, a rewinder gradient magnetic field pulse with polarity reversed from the previously-applied gradient magnetic field pulse Gpe in the phase encode direction is applied in the phase encode direction. Thereby, influence of the gradient magnetic field pulse Gpe in the phase encode direction applied before detection of the MR signal is canceled before acquisition of an MR signal of the next phase encode step.

The foregoing is one cycle, i.e., acquisition of an MR signal of one phase encode step, and is processing within one repetition time TR in FIG. 5. MR signals necessary for reconstructing one image are acquired by repeating this one cycle by the number of phase encode steps.

During an application period of the excitation RF pulse, the whole body coil 34 is used for applying this excitation RF pulse and thus wireless transmission of the synchronization signal from the whole body coil 34 is temporarily stopped as shown in FIG. 5. Then, in synchronization with stop of applying the excitation RF pulse (i.e., in synchronization with polarity reversion of the gradient magnetic field Gss in the slice selection direction), wireless transmission of the synchronization signal is resumed.

In addition, during the application period of the positive gradient magnetic field Gro in the readout direction, i.e., during the detection period of an MR signal, wireless transmission of the synchronization signal is temporarily stopped. This is so that reception sensitivity of each of the coil elements 106a to 106h to an MR signal is not influenced by transmission of the synchronization signal in consideration of weakness of an MR signal emitted from the object P. Then, in synchronization with completion of application of the gradient magnetic field pulse Gro in the readout direction, wireless transmission of the synchronization signal is resumed.

Although two temporary suspension periods are included in one repetition time TR in this example, each of the temporary suspension periods matches a free running period of the voltage-controlled oscillator 146. The above-described "free running" means, for example, a condition where an oscillator automatically oscillates without being externally controlled.

As mentioned above, during a transmission period of the synchronization signal, the phase locked loop 144 (FIG. 4) performs synchronization processing of matching the phase of the coil-side clock signal outputted from the voltage-controlled oscillator 146 with the phase of the control-side clock signal. Further, during a suspension period of the synchronization signal, the phase locked loop 144 temporarily stops the synchronization processing and thus the voltage-controlled oscillator 146 outputs the coil-side clock signal at the frequency outputted immediately before the stop of synchronization processing (i.e., in a free-running mode).

Although two free-running periods are included in each repetition time TR in this example, each of the two free-running periods is a short period. Thus, even if extremely slight phase shift is generated by causing the voltage-controlled oscillator 146 to operate in the free-running mode only in each suspension period of the synchronization signal, the phase shift does not reach a degree of causing a trouble in processing of acquiring data of MR signals.

Since the synchronization signal is continuously transmitted except each suspension period, each transmission period of the synchronization signal is substantially concurrent with each transmission period of gradient magnetic field pulses such as the gradient magnetic field Gpe in the phase encode direction. However, the frequency of the gradient magnetic field pulse in the phase encode direction is, e.g., some hundreds KHz and is considerably separated from the frequency band of the Larmor frequency at intensity of a static magnetic field of a usual MRI apparatus. For example, when intensity of a static magnetic field is 1.5 Tesla, the Larmor frequency is approximately 64 MHz. Since the frequency of each gradient magnetic field pulse is greatly separated from the Larmor frequency, the antenna 130d can detect only the synchronization signal by distinguishing it from various types of gradient magnetic field pulse.

Although an example of a pulse sequence of a gradient echo technique is explained here for simplifying the explanation, each timing of temporarily stopping the synchronization signal in another pulse sequence is similar to that of the above-described example.

FIG. 6 is a flowchart showing an example of a flow of an operation performed by the MRI apparatus 10A of the first embodiment. Hereinafter, according to the step numbers in the flowchart shown in FIG. 6, the operation performed by the MRI apparatus 10A will be described by reference to the above-mentioned FIG. 1 to FIG. 5 as required.

[Step S1] The RF coil 100 is attached to the object P loaded on the table 22 (FIG. 1). In addition, the control information transmission/reception circuit 320 (FIG. 4) wirelessly transmits a command signal requiring transmission of identification information by the antenna 330c.

Thereby, the identification information of the RF coil 100 wirelessly transmitted from the control information response circuit 120 is inputted to the system control function 61 of the processing circuitry 60 via the control information transmission/reception circuit 320 in the above-described manner, and the system control function 61 recognizes that the RF coil 100 is used.

Afterward, the system control function 61 outputs permission of communication between the RF coil 100 and the radio communication device 36 to respective components of the MRI apparatus 10A such the sequence controller 58. Thereby, the variable frequency generation circuit 86 starts generation of the synchronization signal of a fixed frequency as described above. Note that this synchronization signal is within the frequency band of the Larmor frequency and reflects the phase of the control-side clock signal. In addition, under the control of the system control function 61, the sequence controller 58 causes the RF transmitter 48 and the whole body coil 34 (FIG. 2) to start wireless transmission of the synchronization signal. Wireless transmission of the synchronization signal is continued after this.

As an example here, the synchronization signal is continuously transmitted by radio except each detection period of an MR signal and each transmission period of an RF pulse in the pulse sequence (see FIG. 5). Thus, the phase locked loop 144 of the RF coil 100 causes the voltage-controlled oscillator 146 to continuously output the coil-side clock signal synchronized with the control-side clock signal, except each free-running period in the pulse sequence.

In addition, the table moving system 23 (FIG. 1) moves the table 22 into inside of the table 22 under the control of the system control function 61.

Afterward, the processing proceeds to the Step S2.

[Step S2] The system control function 61 sets some of imaging conditions of the main scan such as a type of pulse sequence, based on imaging conditions inputted to the MRI apparatus 10A via the input device 72.

Afterward, the processing proceeds to the Step S3.

[Step S3] The system control function 61 controls the respective components of the MRI apparatus 10A so that prescans are performed. In prescans, for example, a corrected value of RF pulses is calculated.

Afterward, the processing proceeds to the Step S4.

[Step S4] The system control function 61 sets the rest of the imaging conditions of the main scan based on the execution results of the prescans.

Afterward, the control information transmission/reception circuit 320 wirelessly transmits the imaging conditions such as information on the pulse sequence of the main scan and information on coil elements (at least one of 106a to 106h) selected for detecting MR signals in the main scan from the antenna 330c to the antenna 130c.

The imaging conditions transmitted in the above timing include sampling processing information such as a sampling time interval, sampling number, and a delay time from a timing of temporarily stopping the synchronization signal to start of sampling processing.

In addition, the above-described information on the pulse sequence includes an application timing of each of gradient magnetic field pulses, transmission timing of each of RF pulses, and the like.

The control information response circuit 120 outputs the imaging conditions received by the antenna 130c to the control circuit 108 and the synchronization signal reception circuit 124. The control circuit 108 outputs the sampling processing information to each of the A/D converters ADC.

Afterward, the processing proceeds to the Step S5.

[Step S5] The system control function 61 controls the respective components of the MRI apparatus 10A so that the main scan is performed. Specifically, a static magnetic field has been already formed in the imaging space by the static magnetic field magnet 31 excited by the static magnetic field power supply 42. In addition, the shim coil 32 forms an offset magnetic field which uniforms the static magnetic field formed in the imaging space, by using electric currents supplied from the shim coil power supply 44.

Moreover, the gate signal is continuously transmitted by wire from the gate signal transmission circuit 316 to the gate signal reception circuit 116 between the antennas 330b and 130b during the main scan.

Afterward, when an instruction to start imaging is inputted to the system control function 61 of the processing circuitry 60 from the input device 72, MR signals emitted from the object P are acquired by repeating the processing composed of the following sub-steps <1> to <4>.

<1> The sequence controller 58 drives the gradient coil power supply 46, the RF transmitter 48, and the RF receiver 50 according to the pulse sequence inputted from the system control function 61 in such a manner that gradient magnetic fields are formed in the imaging region including the imaging part of the object P and each RF pulse is transmitted from the whole body coil 34 to the object P. During each of the transmission periods of the RF pulses, the sequence controller 58 temporarily stops wireless transmission of a synchronization signal by controlling the RF transmitter 48 and the whole body coil 34. In addition, during each of the transmission periods of the RF pulses, the gate signal is set to, for example, on-level. Thereby, each of the coil elements 106a to 106h of the RF coils 100 becomes the off-state and the above-described coupling effect is prevented.

Although the synchronization signal reception circuit 124 detects the timing of stopping transmission of the synchronization signal by the antenna 130d during the transmission period of an RF pulse, the synchronization signal reception circuit 124 determines that the timing of stopping transmission of the synchronization signal in this sub-step <1> is not an A/D conversion start timing. In this determination, the conditions of the pulse sequence inputted in the step S4 are used.

<2> After completion of transmitting each RF pulse, the sequence controller 58 causes the RF transmitter 48 and the whole body coil 34 to resume wireless transmission of the synchronization signal. In addition, after completion of transmitting each RF pulse, the gate signal is switched over to, for example, off-level and each of the coil elements 106a to 106h switches to the state capable of detecting MR signals. Afterward, in the example of the pulse sequence shown in FIG. 5, the sequence controller 58 causes the RF transmitter 48 and the whole body coil 34 to temporarily stop wireless transmission of the synchronization signal in synchronization with polarity reversion of the gradient magnetic field pulse Gro in the readout direction.

Then, each of the coil elements 106a to 106h detects MR signals caused by nuclear magnetic resonance inside the object P. The detected analogue MR signals are inputted from each of the coil elements 106a to 106h to each of the preamplifiers PMP and amplified, and then inputted to each of the A/D converters ADC. Since an electric current flows in each of the coil elements 106a to 106h and is amplified in each preamplifiers PMP at the same time as emission of MR signals from the object P, the input timing of the analogue MR signals can be regarded as concurrent with the emission timing of MR signals from the object P.

The control circuit 108 causes the preamplifiers PMP and the A/D converters ADC corresponding to non-selected coil elements to stop operation, based on the information on the coil elements selected for detecting MR signals inputted in the step S4. Thus, analogue MR signals detected by only selected coil elements (at least one of 106a to 106h) are inputted to the subsequent stage.

In addition, the synchronization signal reception circuit 124 detects the timing of stopping the synchronization signal immediately before the detection period of an MR signal by the antenna 130d, and determines the detected timing of stopping the synchronization signal as the A/D conversion start timing. In this determination, the conditions of the pulse sequence inputted in the step S4 are used. The synchronization signal reception circuit 124 inputs the A/D conversion trigger signal to each of the A/D converters ADC at the same time as the determination of the A/D conversion start timing.

<3> At the timing when a predetermined delay time elapses from the reception timing of the A/D conversion trigger signal, each of the A/D converters ADC starts sampling processing of an MR signal based on the coil-side clock signal. The above-described predetermined delay time is inputted as the sampling information from the control circuit 108 in the step S4. In addition, the sampling processing is performed according to the sampling time interval and sampling number inputted from the control circuit 108 in the step S4. Each of the A/D converters ADC outputs an MR signal digitized by the sampling processing to the P/S converter PSC.

The P/S converter PSC converts the inputted plural MR signals into a serial signal, and outputs this serial signal to the data transmission circuit 112 (note that, when only one coil element selected for detection in the main scan, one MR signal is inputted to the P/S converter PSC and the generated serial signal includes only one MR signal). The data transmission circuit 112 generates a serial signal for wireless transmission in which plural MR signals are included, by performing a predetermined signal processing on the inputted serial signal, and wirelessly transmits the generated signal from the antenna 130a to the antenna 330a.

Additionally, the sequence controller 58 causes the whole body coil 34 to resume wireless transmission of the synchronization signal, in synchronization with the timing of stopping application of the gradient magnetic field pulse Gro in the readout direction (i.e., the timing of completing detection period of an MR signal emitted from the object).

<4> The data reception circuit 312 extracts the original digitized MR signals by performing the predetermined processing on the serial signal for radio transmission received by the antenna 330a, and outputs the extracted MR signals to the frequency downconversion circuit 50a of the RF receiver 50. The frequency downconversion circuit 50a performs frequency downconversion on the inputted MR signals, and outputs the MR signals whose frequency is lowered to the data generation circuit 50b. The data generation circuit 50b generates raw data of the MR signals by performing the predetermined processing on the inputted MR signals, and outputs the raw data of the MR signals to the image reconstruction function 62 of the processing circuitry 60. The image reconstruction function 62 converts the raw data of MR signals into k-space data, and stores the k-space data in the memory circuitry 76.

After completing acquisition of MR signals by repeating the processing of the above-described sub-steps <1> to <4>, the processing proceeds to the step S6.

[Step S6] The image reconstruction function 62 reconstructs image data by performing the image reconstruction processing on the k-space data, outputs the reconstructed image data to the image processing function 64, and stores the reconstructed image data in the memory circuitry 76 (FIG. 1).

Afterward, the processing proceeds to the Step S7.

[Step S7] The image processing function 64 generates display image data by performing predetermined image processing on the reconstructed image data, and stores the display image data in the memory circuitry 76. The system control function 61 transfers the display image data to the display 74 and causes the display 74 to display images indicated by the display image data.

The foregoing is the explanation of the operation of the MRI apparatus 10A of the first embodiment.

As mentioned above, in the first embodiment, the variable frequency generation circuit 86 generates the synchronization signal of a fixed frequency within the frequency band of the Larmor frequency in such a manner that the phase of the control-side clock signal is reflected on the synchronization signal. Then, the whole body coil 34 wirelessly transmits the synchronization signal, and the phase locked loop 144 of the RF coil 100 synchronizes the coil-side clock signal with the control-side clock signal based on the synchronization signal.

As long as RF pulses of the Larmor frequency are used in the MRI apparatus 10A, electromagnetic waves of the frequency band of the Larmor frequency can be used in a country where installation of the MRI apparatus 10A is legally allowed. This holds true regardless of regulations of radio in the country. Accordingly, in digital radio communication of MR signals, clock synchronization between the control side of the MRI apparatus 10A and the side of the wireless RF coil 100 can be achieved regardless of regulations of radio being different from country to country. Thus, it is unnecessary to consider a problem of a possible new radio law.

Moreover, the whole body coil 34 implements a function of transmitting the synchronization signal in addition to the function of transmitting RF pulses, by taking advantage of that the resonance frequency of the whole body coil 34 to be generally used for transmitting RF pulses is the Larmor frequency. Hence, it is not necessary to provide a further hardware component for transmitting the synchronization signal.

Furthermore, sampling information such as a sampling time interval and a delay time from the timing of temporarily stopping transmission of the synchronization signal to the A/D conversion start timing is wirelessly transmitted to the RF coil 100 side before the main scan. The RF coil 100 side detects the timing of temporary stop of the synchronization signal, determines this timing as the A/D conversion trigger timing, and starts A/D conversion at the timing when the above-described delay time elapses from the A/D conversion trigger timing. Thus, the RF coil 100 side can determine the sampling start timing in synchronization with the control side of the MRI apparatus 10A (i.e., the RF receiver 50 side).

<Second Embodiment>

Figure 7:
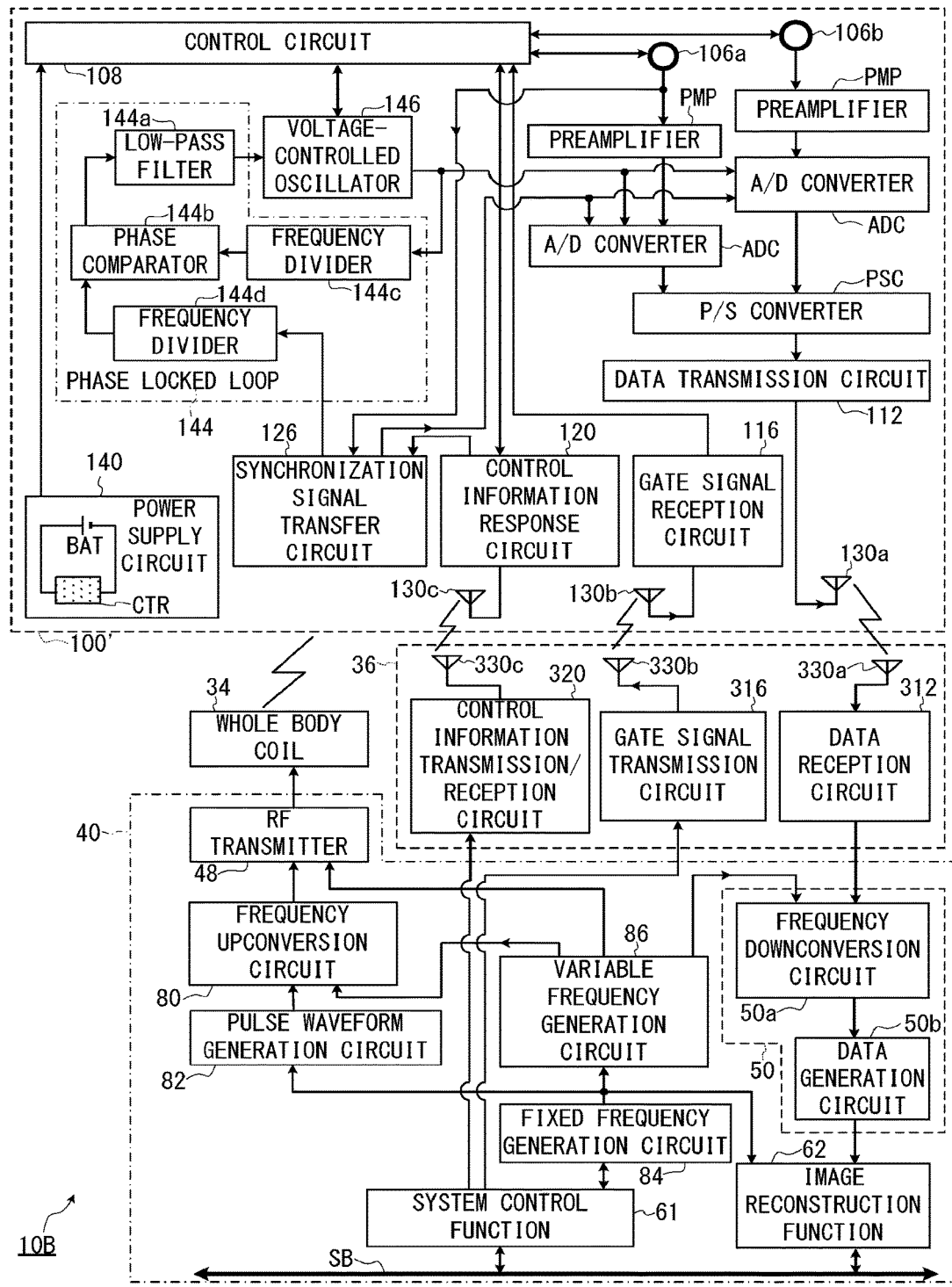
FIG. 7 is a functional block diagram showing an example of components relevant to the digital radio communication system of the MRI apparatus of the second embodiment.

FIG. 7 is a functional block diagram showing an example of components relevant to the digital radio communication system of the MRI apparatus 10B of the second embodiment. The difference between the first and second embodiments lies in that configuration of the RF coil 100' side in the second embodiment is different from that of the first embodiment in the following two points.

Firstly, in the RF coil 100' of the second embodiment, the antenna 130d is omitted and one of the coil elements 106a to 106h implements a function of receiving the synchronization signal in addition to detecting MR signals. In order to detect MR signals whose frequency is the Larmor frequency, circuit constants of each of the coil elements 106a to 106h such as wiring capacity and a resistance value are selected so that reception sensitivity becomes high at the Larmor frequency. Thus, each of the coil elements 106a to 106h can detect the synchronization signal of the frequency band of the Larmor frequency with high sensitivity.

Secondly, in the RF coil 100' of the second embodiment, a synchronization signal transfer circuit 126 is provided instead of the synchronization signal reception circuit 124.

Hereinafter, only the different points will be explained and duplicate explanation is omitted.

Although any one of the coil elements 106a to 106h may implement the function of receiving the synchronization signal, it is assumed that the coil element 106a implements the function of receiving the synchronization as an example here.

The synchronization signal transfer circuit 126 includes non-illustrated circuit elements such as an amplifier and outputs the synchronization signal detected by the coil element 106a to the frequency divider 144d of the phase locked loop 144 on a real-time basis. In addition, the synchronization signal transfer circuit 126 determines the A/D conversion trigger timing from the synchronization signal detected by the coil element 106a, based on conditions of the pulse sequence and the sampling processing information.

The flow of the operation of the MRI apparatus 10B of the second embodiment is similar to that of the first embodiment except the following four points in processing of the step S4 and the sub-steps <1> and <2> of the step S5 in FIG. 6, and a duplicate flowchart is omitted.

Firstly, the gate signal reception circuit 116 always outputs the on-level gate signal to the coil element 106a for detecting the synchronization signal as an example, regardless of level of the gate signal continuously inputted to the gate signal reception circuit 116. Thereby, the gate signal reception circuit 116 causes the coil element 106a to be always under a condition where the coil element 106a can receive a radio-frequency signal. Meanwhile, the gate signal reception circuit 116 outputs the gate signal received by the antenna 130b to the coil elements 106b to 106h which are not used for detecting the synchronization signal, on a real-time basis in a manner similar to the first embodiment.

Secondly, in the step S4, the control information response circuit 120 outputs the imaging conditions received by the antenna 130c such as conditions of the pulse sequence and the sampling processing information to the control circuit 108 and the synchronization signal transfer circuit 126.

Thirdly, in the sub-step <1> of the step S5, the synchronization signal transfer circuit 126 detects the timing of stopping transmission of the synchronization signal inputted from the coil element 106a on a real-time basis during the transmission period of RF pulses. However, the synchronization signal transfer circuit 126 determines that this timing of stopping transmission of the synchronization signal detected in the sub-step <1> is not the A/D conversion start timing. In this determination processing, the conditions of the pulse sequence inputted in the step S4 are used.

Fourthly, in the sub-step <2> of the step S5, the synchronization signal transfer circuit 126 determines that the timing of stopping transmission of the synchronization signal immediately before the detection period of an MR signal as the A/D conversion start timing, based on the conditions of the pulse sequence. The synchronization signal transfer circuit 126 outputs the A/D conversion trigger signal to each of the A/D converters ADC at the same time as determining the A/D conversion start timing.

As mentioned above, the same effects as the first embodiment can also be obtained in the second embodiment.

Moreover, since one of the coil elements 106a to 106h implements the function of detecting the synchronization signal aside from detecting MR signals in the second embodiment, there is also the advantage that it is unnecessary to provide an antenna used only for detecting the synchronization signal in the RF coil 100'.

<Third Embodiment>

Figure 8:
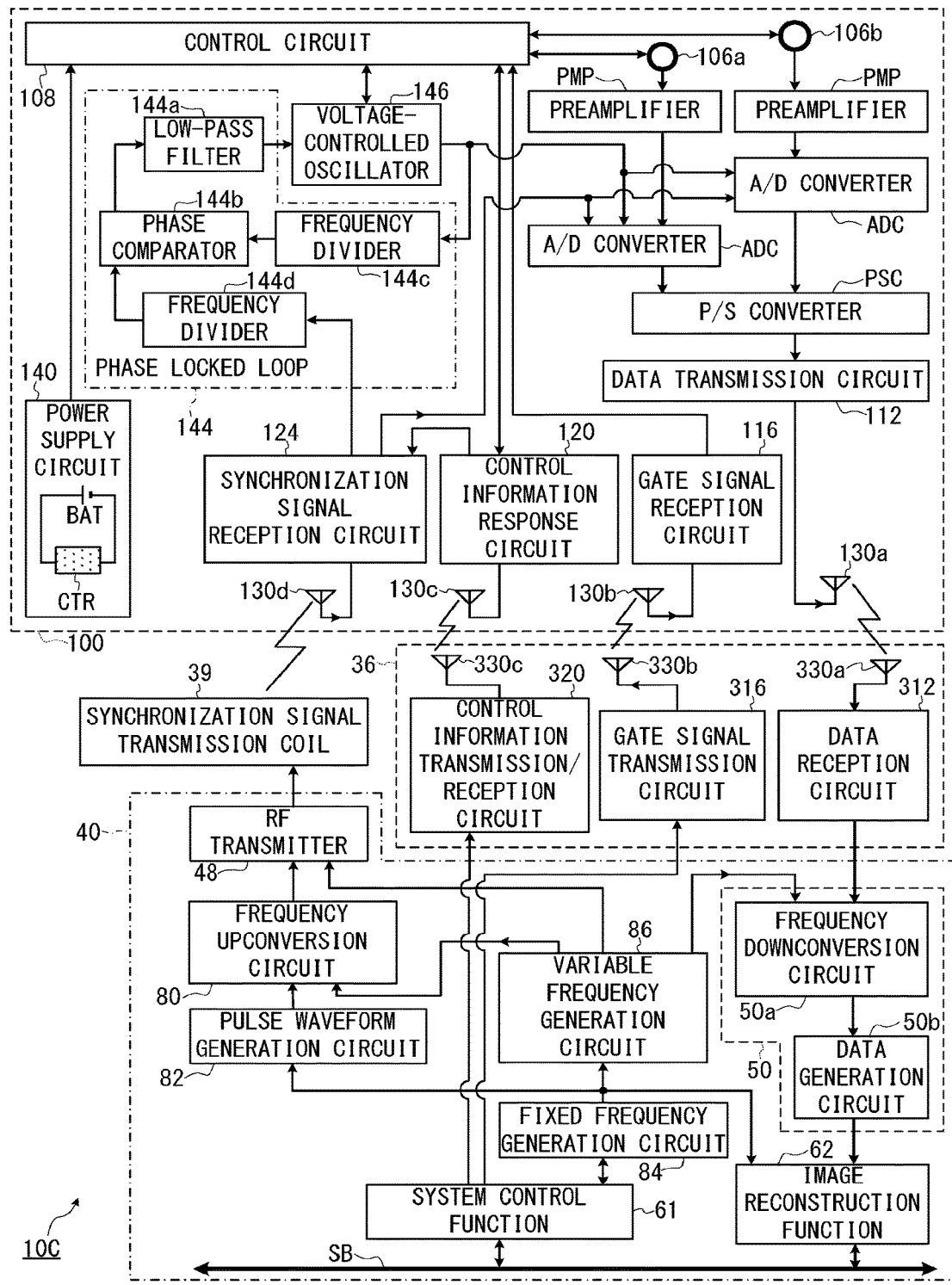
FIG. 8 is a functional block diagram showing an example of components relevant to the digital radio communication system of the MRI apparatus of the third embodiment.

FIG. 8 is a functional block diagram showing an example of components relevant to the digital radio communication system of the MRI apparatus of 10C the third embodiment. The difference between the MRI apparatus 10C of the third embodiment and the MRI apparatus 10A of the first embodiment lies in that a synchronization signal transmission coil 39 is provided separately from the whole body coil 34 in the third embodiment. Hereinafter, the MRI apparatus 10C of the third embodiment will be explained focusing only on the difference between the first and third embodiments.

As to the synchronization signal transmission coil 39, circuit constants such as a resistance value are selected, for example, in such a manner that its resonance frequency becomes the frequency of the synchronization signal (i.e., the frequency band of the Larmor frequency). The variable frequency generation circuit 86 outputs the synchronization signal of a fixed frequency to the RF transmitter 48. Note that this synchronization signal is within the frequency band of the Larmor frequency and reflects the phase of the control-side clock signal. Then, the RF transmitter 48 causes the synchronization signal transmission coil 39 to wirelessly transmit this synchronization signal.

The synchronization signal transmission coil 39 is preferably positioned inside the bore of the gantry 30 during imaging. Thus, for example, the synchronization signal transmission coil 39 may be disposed inside the gantry 30 or inside the table 22.

In the third embodiment, the whole body coil 34 is not used for transmission of the synchronization signal. Thus, the sequence controller 58 may simply control the synchronization signal transmission coil 39 in such a manner that the synchronization signal transmission coil 39 continuously wirelessly transmits the synchronization signal even in each transmission period of an RF pulse, while only avoiding each detection period of an MR signal. This is so that timing control of wireless transmission is simplified.

Meanwhile, intensity of an RF pulse is over 100 times stronger than that of the synchronization signal as an example. Thus, the synchronization signal may be buried in an RF pulse during a transmission period of each RF pulse.

This causes the RF coil 100 side to be unable to detect the synchronization signal by the antenna 130d. Accordingly, there is a possibility that the RF coil 100 side incorrectly recognizes the start time of a transmission period of an RF pulse as the timing of stopping the synchronization signal.

Thus, the synchronization signal reception circuit 124 preferably determines whether the timing of stopping transmission of the synchronization signal detected by the antenna 130d is the A/D conversion start timing or not, based on conditions of the pulse sequence in a manner similar to the first embodiment.

As mentioned above, the same effects the first embodiment can also be obtained in the third embodiment.

<Fourth Embodiment>

Figure 9:
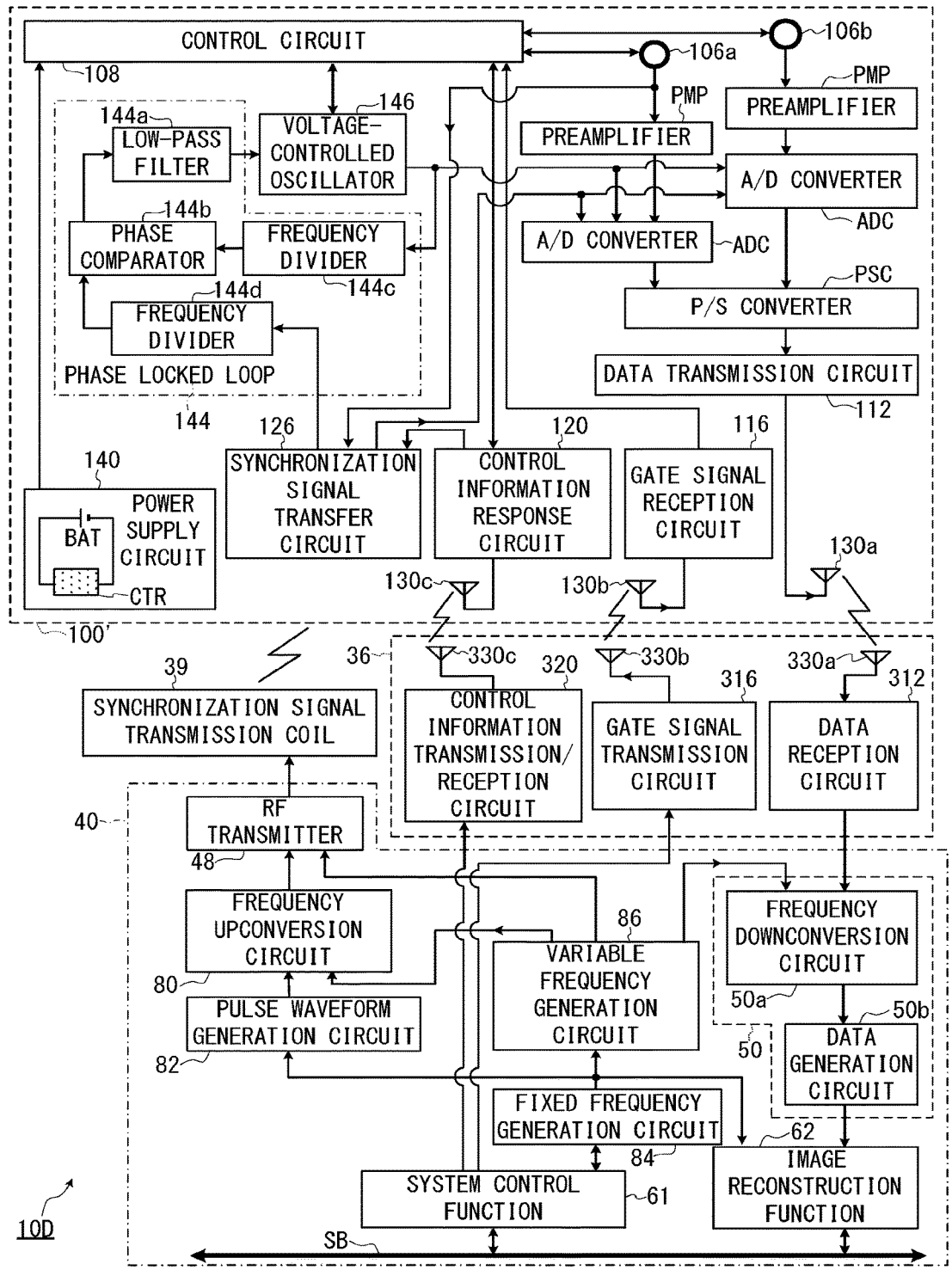
FIG. 9 is a functional block diagram showing an example of components relevant to the digital radio communication system of the MRI apparatus of the fourth embodiment.

FIG. 9 is a functional block diagram showing an example of components relevant to the digital radio communication system of the MRI apparatus 10D of the fourth embodiment. The MRI apparatus 10D of the fourth embodiment is similar to the MRI apparatus 10B of the second embodiment, except that the MRI apparatus 10D further includes the synchronization signal transmission coil 39 like the third embodiment.

In other words, the whole body coil 34 is not used for transmission of the synchronization signal and one of the coil elements 106a to 106h of the RF coil 100' side detects the synchronization signal in the fourth embodiment.

As mentioned above, the same effects the first embodiment can also be obtained in the fourth embodiment.

According to each of the above-mentioned embodiments, in digital radio communication of MR signals, clock synchronization between a control side of an MRI apparatus and a wireless RF coil side can be achieved regardless of Law/Regulations of Radio being different from country to country.

<Supplementary Notes on Embodiments>

[1] In each of the first to the fourth embodiments, an example in which the wireless RF coil 100 or 100' for the chest is used has been explained. However, embodiments of the preset invention are not limited to such an aspect. Each of the MRI apparatuses 10A to 10D can use various types of mountable wireless RF coil such as a wireless RF coil for a shoulder and a wireless RF coil for a knee for receiving MR signals in addition to the RF coils 100 and 100'.

Moreover, each of the MRI apparatuses 10A to 10D includes non-illustrated connection ports on the table 22 and can use not only wireless RF coils but also wired type RF coils. The above-described wired type RF coil is an RF coil which is attached to an object, connected to one of the connection ports by a cable, and transmits data of detected MR signals by wire via the connection port. Each of the above-described RF coils may be interpreted as a part of each of the MRI apparatuses 10A to 10D or may be interpreted as a separate component independent of each of the MRI apparatuses 10A to 10D.

[2] In the first and second embodiments, examples in which wireless transmission of the synchronization signal is temporarily stopped during each transmission period of an RF pulse from the whole body coil 34 have been explained. However, embodiments of the preset invention are not limited to such an aspect.

For example, consider a case where an RF coil configured to implement both functions of transmitting RF pulses and receiving MR signals like a wireless RF coil for a head is attached to the object P and RF pulses are transmitted not from the whole body coil 34 but from this wireless RF coil. In this case, the whole body coil 34 may continuously transmit the synchronization signal by radio including each period of transmitting an RF pulse performed by the wireless RF coil.

[3] In the second and fourth embodiment, examples in which one of the coil elements 106a to 106h is used for detecting the synchronization signal have been explained. However, embodiments of the present invention are not limited to such an aspect. Two or more of the coil elements 106a to 106h may be used for detecting the synchronization signal.

[4] Correspondences between terms used in the claims and terms used in the embodiments described above will be described. Note that the correspondences described below are just some of possible interpretations for reference and should not be construed as limiting the present invention.

The fixed frequency generation circuit 84 is an example of a control side oscillator described in the claims.

The voltage-controlled oscillator 146 is an example of a coil side oscillator described in the claims.

The control information transmission/reception circuit 320 and the antenna 330c are an example of the sequence information transmission circuit described in the claims.

In the first and the second embodiments, the entirety of the processing circuitry 60, the sequence controller 58, the variable frequency generation circuit 86, the RF transmitter 48, and the whole body coil 34 is an example of the synchronization signal transmission circuit described in the claims.

[5] In the third and the fourth embodiment, the entirety of the processing circuitry 60, the sequence controller 58, the variable frequency generation circuit 86, the RF transmitter 48, and the synchronization signal transmission coil 39 is an example of the synchronization signal transmission circuit described in the claims.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:
   a wireless radio frequency (RF) coil;
   a whole body coil configured to transmit an RF pulse having a Larmor frequency to an object;
   a control-side oscillator configured to output a control-side clock signal to execute a pulse sequence; and
   a synchronization signal transmission circuit configured to wirelessly transmit a synchronization signal to the wireless RF coil in an executing period of the pulse sequence, except in an MR-signal detection period during which the wireless RF coil detects a magnetic resonance signal,
   wherein the synchronization signal is to synchronize a clock signal in the wireless RF coil with the control-side clock signal, a frequency of the synchronization signal is within a frequency band of the Larmor frequency, and the synchronization signal reflects a phase of the control-side clock signal.

2. The MRI apparatus according to claim 1, wherein the whole body coil is further configured to transmit both the RF pulse to the object and the synchronization signal to the wireless RF coil, and
   wherein the synchronization signal transmission circuit is further configured to wirelessly transmit the synchronization signal ire the executing period of the pulse sequence, except in the MR-signal detection period and a transmission period of the RF pulse.

3. The MRI apparatus according to claim 1,
wherein the synchronization signal transmission circuit is further configured to wirelessly transmit the synchronization signal with such intensity that the synchronization signal is weaker in intensity than the RE pulse and does not magnetically excite nuclear spin of the object.

4. The MRI apparatus according to claim 2,
wherein the wireless RE coil includes a coil side oscillator configured to output a coil-side clock signal used for sampling processing of the magnetic resonance signal and. a phase locked loop configured to perform synchronization control in which the coil-side clock signal is synchronized with the control-side clock signal based on the synchronization signal; and
the wireless RF coil is further configured to stop the synchronization control and cause the coil side oscillator to operate in a free-running mode at a frequency immediately before stopping of the synchronization control, in the MR-signal detection period and the transmission period of the RF pulse.

5. The MRI apparatus according to claim 1, further comprising a gantry which includes a gradient coil configured to apply a gradient magnetic field pulse and the whole body coil,
wherein the synchronization signal transmission circuit includes a synchronization signal transmission coil configured to wirelessly transmit the synchronization signal as a coil aside from the whole body coil.

6. The MRI apparatus according to claim 5,
wherein wireless RF coil includes a coil side oscillator configured to output a coil-side clock signal used for sampling processing of the magnetic resonance signal and a phase locked loop configured to perform synchronization control in which the coil-side clock signal is synchronized with the control-side clock signal based on the synchronization signal; and
the wireless RF coil is further configured to stop the synchronization control and cause the coil side oscillator to operate in a free-running mode at a frequency immediately before stopping of the synchronization control, in the MR-signal detection period.

7. The MRI apparatus according to claim 1,
wherein the wireless RF coil includes a coil side oscillator configured to output a coil-side clock signal to perform sampling processing of the magnetic resonance signal and a phase locked loop configured to synchronize the coil-side clock signal with the control-side clock signal based on the synchronization signal.

8. The MRI apparatus according to claim 1, further comprising a sequence information transmission circuit configured to wirelessly transmit sampling processing information to the wireless RE coil before start of the pulse sequence,
wherein the sampling processing information includes a delay time before start, of sampling processing of the magnetic resonance signal, time interval of the sampling processing, and a sampling number of the sampling processing; and
the wireless RF coil is configured to start the sampling processing according to the sampling processing information, after a lapse of the delay time from a stop timing of the synchronization signal.

9. The MRI apparatus according to claim 1,
wherein the synchronization signal transmission is further configured to wirelessly transmit the synchronization signal whose frequency is shifted from the Larmor frequency by a predetermined margin.

10. A magnetic resonance imaging (MRI) apparatus configured to wirelessly connected to a wireless radio frequency (RF) coil, the MRI apparatus comprising:
a whole body coil configured to transmit an RF pulse having a Larmor frequency to an object;
a control-side oscillator configured to output a control-side clock signal to execute a pulse sequence; and
a synchronization signal transmission circuit configured to wirelessly transmit a synchronization signal to the wireless RF coil in an executing period of the pulse sequence, except in an MR-signal detection period during which the wireless RF coil detects a magnetic resonance signal,
wherein the synchronization signal is to synchronize a clock signal in the wireless RF coil with the control-side clock signal, a frequency of the synchronization signal is within a frequency band of the Larmor frequency, and the synchronization signal reflects a phase of the control-side clock signal.

11. The MRI apparatus according to claim 10, wherein the whole body coil is configured to transmit both the RF pulse to the object and the synchronization signal to the wireless RF coil, and
wherein the synchronization signal transmission circuit is further configured to wirelessly transmit the synchronization signal in the executing period of the pulse sequence, except the MR-signal detection period and a transmission period of the RF pulse.

12. The MRI apparatus according to claim 10,
wherein the synchronization signal transmission circuit is further configured to wirelessly transmit the synchronization signal with such intensity that the synchronization signal is weaker in intensity than the RF pulse and does not magnetically excite nuclear spin, of the object.

* * * * *